US008677210B2

(12) United States Patent
Sayadi et al.

(10) Patent No.: US 8,677,210 B2
(45) Date of Patent: Mar. 18, 2014

(54) METHOD FOR ENCODING DATA WITH DOUBLE-INTERLACED PARITY SYMBOLS, FOR A RADIO INFRASTRUCTURE, AND ASSOCIATED CODEC

(75) Inventors: Bessem Sayadi, Nozay (FR); Yann Leprovost, Nozay (FR)

(73) Assignee: Alcatel Lucent, Paris (FR)

( * ) Notice: Subject to any disclaimer, the term of this patent is extended or adjusted under 35 U.S.C. 154(b) by 130 days.

(21) Appl. No.: 13/145,880

(22) PCT Filed: Jan. 19, 2010

(86) PCT No.: PCT/FR2010/050082
§ 371 (c)(1),
(2), (4) Date: Sep. 27, 2011

(87) PCT Pub. No.: WO2010/084283
PCT Pub. Date: Jul. 29, 2010

(65) Prior Publication Data
US 2012/0008706 A1 Jan. 12, 2012

(30) Foreign Application Priority Data

Jan. 23, 2009 (FR) ..................................... 09 50416

(51) Int. Cl.
*H03M 13/00* (2006.01)
(52) U.S. Cl.
USPC ........... 714/762; 714/761; 714/755; 714/752; 375/295
(58) Field of Classification Search
None
See application file for complete search history.

(56) References Cited

U.S. PATENT DOCUMENTS

| 2010/0011274 A1* | 1/2010 | Stockhammer et al. ...... 714/752 |
| 2010/0027726 A1* | 2/2010 | Lin ................................. 375/346 |
| 2010/0031121 A1* | 2/2010 | Ottavj et al. ................... 714/762 |
| 2012/0198303 A9* | 8/2012 | Song et al. ..................... 714/758 |
| 2013/0031444 A1* | 1/2013 | Guo ............................. 714/776 |

FOREIGN PATENT DOCUMENTS

| EP | 1 928 116 A2 | 6/2008 |
| WO | WO 2008090182 A1 * | 7/2008 ................ H04L 1/00 |

OTHER PUBLICATIONS

ETSI: "Digital Video Broadcasting (DVB) MPE-IFEC," DVB Standard, No. A131, 16 pages, XP002547119, Nov. 2008.

(Continued)

*Primary Examiner* — Albert Decady
*Assistant Examiner* — Justin R Knapp
(74) *Attorney, Agent, or Firm* — Fay Sharpe LLP

(57) ABSTRACT

A method is dedicated to encoding data that must be transmitted by means of a wave-based transmission infrastructure, and comprises i) a step consisting of creating in parallel M first matrices having T rows and C columns with subsets of data from B successive received bursts, the subsets of data from each burst being distributed within at least two successive first matrices, ii) a step consisting of creating in parallel M second matrices each having T rows and N columns with parity symbols resulting from encoding the data that is respectively contained in the rows of each of the M first matrices, iii) a step consisting of creating in parallel M first matrices having K rows and C columns with parity symbols resulting from encoding the data that is respectively contained in the columns of each of the M first matrices, and iv) a step consisting of distributing by interlacing, firstly, J subsets of parity symbols from each second matrix into J successive sets, and secondly P subsets of parity symbols from each third matrix into P of these successive sets, and of placing into each of the successive sets the respective data from the successive received bursts.

20 Claims, 1 Drawing Sheet

OTHER PUBLICATIONS

Figure 1:
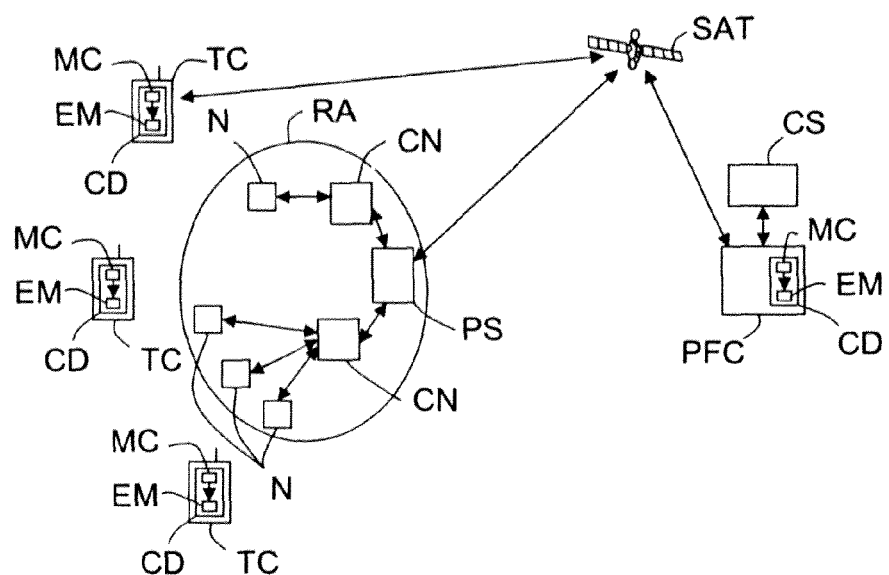

David Gozalvez et al., "Performance evaluation of the MPE-iFEC Sliding RS Encoding for DVB-H streaming services," Personal, Indoor and Mobile Radio Communications, 2008, PIMRC 2008, IEEE 19th International Symposium ON, IEEE, Poscataway, NJ, USA 5 pages, XP031371647, Sep. 15, 2008.

International Search Report for PCT/FR2010/050082 dated Apr. 23, 2010.

* cited by examiner

METHOD FOR ENCODING DATA WITH DOUBLE-INTERLACED PARITY SYMBOLS, FOR A RADIO INFRASTRUCTURE, AND ASSOCIATED CODEC

The invention relates to the transmission of data by wave-based transmission infrastructure.

Here, the term "wave-based transmission infrastructure" refers to any communication infrastructure in which data is transmitted by waves. Consequently, it may be either a radio communication network or a wave broadcasting network. As nonlimiting examples, it may therefore be a wireless broadcasting network (such as a terrestrial DVB-H (for "Digital Video Broadcasting-Handhelds" network for mobile television), or a hybrid network (meaning one that is both satellite-based and terrestrial (such as a DVB-SH (for "Digital Video Broadcasting-Satellite services to Handhelds") (or DVB-SSP) network—satellite channel coupled to a terrestrial relay radio channel))), or a cellular or mobile network (such as a GSM/EDGE or UMTS network) or a metropolitan area network or MAN (such as, for example, a WiMAX network).

As a reminder, the DVB-SH network is a hybrid variant of the DVB-H network (for "Digital Video Broadcasting-Handhelds") that was developed for mobile television, i.e. for the one-way broadcasting of content, specifically television programs, in "broadcast" (point-to-point) or "multicast" (point-to-multipoint) mode. In a DVB-SH network, the satellite channel is intended to provide global coverage while the terrestrial radio relay channel is intended to provide cellular coverage on the ground. As a reminder, the transmission of content in broadcast or multicast mode is done by means of dedicated services, which may potentially be time division multiplexed.

As is known to a person skilled in the art, radio signals transmitted by an infrastructure, for example a hybrid infrastructure, are subject to degradations, in particular when they travel on the S band (between about 1.55 GHz and about 5.2 GHz). The level of these degradations may vary depending on the environment of the communication terminals that are the recipients of the transmitted data (potentially content). In fact, the propagation channel may be in several different states that depend on the weakening level of the direct signal caused by a local dead zone (such as due to the presence of one or more trees or buildings). For example, by applying a Markov model to a DVB-SH infrastructure, it may be shown that the channel can be in three states known as LOS (for "Line Of Sight" (within the axis of the emitter)), shadowed, and blocked. In the presence of a satellite angle elevation of about 40°, the Markov model reproduces the weakening variations of the large-scale or very weak variations in two main environments respectively known as ITS (for "Intermediate Tree Shadowing") and suburban (or SUB).

In order to guarantee the mobile terminals a high quality of service in the presence of difficult radio conditions (for example, deep weakening or faulty alignment with the emitter), some networks, such as DVB-SH networks, implement diversity at a broad temporal scale. This diversity may be provided by interleaving performed at the level of the physical layer (for class 2 terminals) or the link layer (for class 1 terminals). Interleaving at the link layer level is an interleaving in IP bursts, known as MPE-IFEC (for "MulitiProtocol Encapsulation-Inter-bursts Forward Error Code").

As a reminder, the technique known as FEC consists of adding redundancy to data on the transmission and in order to enable correction at the reception end of part of the errors introduced by losses over that data's transmission channel.

The MPE-IFEC technique relies on the simultaneous creation of M first (encoding/decoding) matrices, known as ADTs (for "Application Data Tables"), and created from subsets of data from at least one received burst (potentially an IP (Internet Protocol) burst), the subsets of data from each burst being distributed among at least one encoding/decoding matrix, then the simultaneous creation of M second matrices, known as FDT (for "FEC Data Tables") made up of parity symbols resulting from a (Reed-Solomon) encoding of the data that is contained within the first M matrices, and finally the distribution by simply interleaving subsets of parity symbols from each second matrix into S successive sets containing at least the respective data from the successive received bursts. It should be noted that the S sets of FEC data are sent with the corresponding data in a time slice generally known as a "time-slice burst". The MPE-IFEC coding technique is also described in the document DVB Bluebook A.131, entitled "MPE-IFEC (draft TS 102 772 V1.1.1)", published in November 2008 by the ETSI (European Telecommunication Standard Institute).

An ITS environment requires an increase in the wave of consecutive erroneous bursts, and a decrease in the length of consecutive non-erroneous bursts. On the other hand, a SUB environment requires a decrease in the length of consecutive erroneous bursts, and an increase in the length of consecutive non-erroneous bursts. However, it may be shown that the MPE-IFEC technique is not truly efficient in the presence of an ITS environment unless the interlacing is very deep (typically 30 seconds, which corresponds to a high-value S variable), whereas it is not truly efficient in the presence of a SUB environment unless the interlacing is shallow (typically 10 seconds, which corresponds to a low-value S variable). The operator of a DVB-SH network is therefore required to configure the network based on the worst-case environment, i.e. the ITS environment.

It is therefore a purpose of the invention to improve the situation in a wave-based transmission infrastructure.

To that end, it proposes a method devoted to encoding data that is to be transmitted by means of a wave-based transmission infrastructure, and comprising the following steps:

creating in parallel M first matrices, each with T rows and C columns, with data subsets from B successive received bursts, the data subsets from each burst being distributed within at least two successive first matrices, creating in parallel M second matrices, each with T rows and N columns, with parity symbols resulting from an encoding of the data that is respectively contained in the rows of each of the M first matrices, creating in parallel M third matrices, each with K rows and C columns, with parity symbols resulting from an encoding of the data that is respectively contained in the columns of each of the M first matrices, interleaving both J subsets of parity symbols from each second matrix into J successive sets, and P subsets of parity symbols from each third matrix into P of those successive sets, and placing the respective data from the received successive bursts into each of the successive sets.

The method of the invention may comprise other characteristics, which may be taken separately or in combination, in particular:

the variable M may be defined by the equation $M = B + \max(0; \max(J; P) - D) + \max(0; D - B)$, where $\max()$ is the maximum function and D is a duration, expressed as a number of bursts, between the moment when the data from one burst is received and the moment when the infrastructure transmits the data from that same burst;

the variable B may be equal to 3;

the variable J may be equal to 2;

the variable P may be equal to 4;

the M first matrices may be constituted by means of a technique known as "multiprotocol encapsulation (MPE)";

the M second matrices and the M third matrices may be constituted by means of a technique known as "forward error correction (FEC)".

The invention also proposes a codec (or "coder-decoder"), intended to equip a communication device capable of connecting to a wave-based transmission infrastructure, and comprising:

coding means tasked with creating in parallel:

M first matrices, each with T rows and C columns, with data subsets from B successive received bursts, the data subsets from each burst being distributed within at least two successive first matrices, M second matrices, each with T rows and N columns, with parity symbols resulting from an encoding of the data that is respectively contained in the rows of each of the M first matrices.

M third matrices, each with K rows and C columns, with parity symbols resulting from an encoding of the data that is respectively contained in the columns of each of the M first matrices, interleaving means tasked with interleaving both J subsets of parity symbols from each second matrix into J successive sets, and P subsets of parity symbols from each third matrix into P of those successive sets, and placing the respective data from the received successive bursts into each of the successive sets.

The coding means may, for example, be tasked with creating the M first matrices by means of a technique known as "multiprotocol encapsulation (MPE)";

In a variant or as a complement, the coding means may for example be tasked with creating the M third matrices by means of a technique known as "forward error correction (FEC)".

The invention is particularly suitable, though not exclusively so, to DVB-SH (or DVB-SSP) hybrid networks, as well as all of their evolutions. However, the invention generally applies to any type of wave-based data transmission infrastructure.

Figure 2:
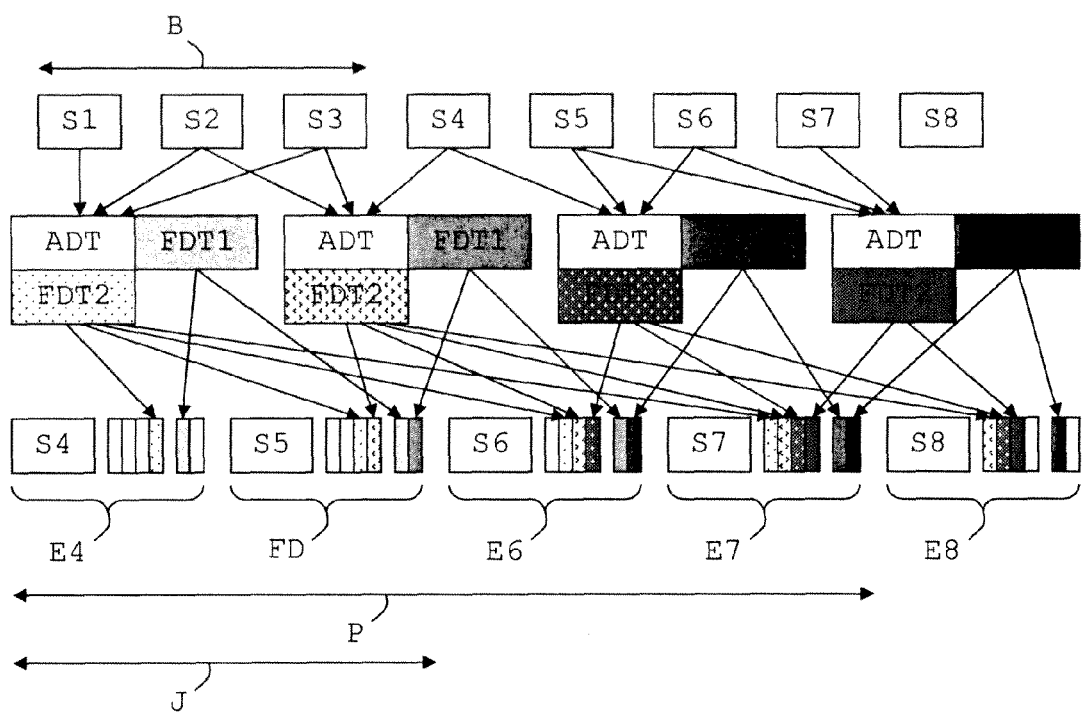

Other characteristics and advantages of the invention will become apparent upon examining the detailed description below, and the attached drawings, wherein:

FIG. 1 schematically and functionally depicts a hybrid transmission infrastructure enabling the implementation of the invention, and FIG. 2 partially and schematically depicts an example of IP burst data encoding according to the invention.

The attached drawings may serve not only to complete the invention, but also to contribute to its definition as necessary.

It is an object of the invention to propose a data encoding method in view of having a wave-based transmission infrastructure transmit that data.

In what follows, it is assumed by way of a nonlimiting example that the wave-based transmission infrastructure is a hybrid infrastructure (PFC, SAT, RA), and more specifically that it is a DVB-SH (or DVB-SSP) network. However, the invention is not limited to this type of wave-based transmission infrastructure. Rather, it pertains to any type of infrastructure that can transmit data (potentially content, potentially multimedia), via waves, to radio communication terminals. Consequently, it may be either a radio communication network or a wave broadcasting network. By way of nonlimiting examples, it may also be a wireless broadcasting network (such as, for example, a DVB-H terrestrial network (for "Digital Video Broadcasting-Handhelds"-mobile television), or a cellular or mobile network (such as a GSM/EDGE or UMTS network) or a metropolitan area network or MAN (such as, for example, a WiMAX network).

Furthermore, it is assumed in what follows, by way of a nonlimiting example, that the radio communication terminals (TC) are mobile (or cellular) telephones or communicating personal digital assistants (or PDAs). However, the invention is not limited to this type of radio communication terminal. Rather, it pertains to any communication device, whether fixed or mobile (or portable or cellular), capable at least of receiving data via waves by means of an infrastructure of the aforementioned type. Consequently, it may also be any desktop or portable computer, a multimedia content received for (Such as, for example, a residential gateway) or an STB ("Set-Top Box")), provided that it is equipped with means of wave communication capable at least of receiving data.

Furthermore, it is assumed in what follows, by way of nonlimiting examples, that the data, broadcast towards the terminals (TC), is multimedia content data such as television programs. However, the invention is not limited to this type of traffic. It also pertains to any type of content, and particularly videos, data files, signaling data, radio programs, and audio content.

As is schematically depicted in FIG. 1, the implementation of the invention requires the existence of a wave-based transmission infrastructure, here of a hybrid type, and therefore comprising a satellite transmission channel and a terrestrial radio transmission channel.

The satellite transmission channel comprises a satellite-based platform (or gateway) PFC for providing encoded content, and at least one communications satellite SAT coupled to one another by means of waves.

The satellite-based platform PFC is, for example, coupled to a content server SC that supplies it with content in the form of bursts, here of the IP type (it may be NAL (video) or RTP packet data, for example). It is tasked with encoding this received content by means of a codec CD (implementing a method according to the invention) for transmitting that content via waves to the (communication) satellite SAT, which is then tasked with retransmitting (broadcasting) it to the terminals TC, either directly or indirectly via the terrestrial radio transmission channel.

This terrestrial radio transmission channel comprises at least one radio access network RA that may, for example, form part of a mobile (or cellular) communication network. This is the assumption that is adopted in what follows, by way of a nonlimiting example. For example, this radio access network RA is UTRAN (or 3G). It therefore primarily comprises base stations N (known as Node Bs in a UTRAN) and radio network controllers CR (Known as RNCs in a UTRAN) connected to one another, as well as a satellite communication device PS that is coupled by means of waves to the satellite SAT (in order to receive the encoded content) and by wires to the radio network controllers CR (in order to supply them with received encoded content.

The terminals TC may receive the encoded content either directly from the satellite SAT, when they are not located within a dead zone, or from the base stations N, when they are located within a dead zone.

Each terminal TC comprises a codec CD, similar to the one that equips the satellite platform PFC, no as to be able to decode the encoded content that it receives.

The invention proposes to implement within the codec CD of the satellite platform PFC a method for encoding the received content data in the form of IP bursts (and more specifically, encapsulated in RTP/UDP/IP). It is a reminder that the term IP datagrams is applied to data contained within an IP burst.

The inventive method comprises four main steps that are performed by the codec CD when its satellite platform PFC receives content data bursts from the content server SC.

A first main step of the inventive method consists of creating in parallel M first matrices, each with T rows and C columns with data subsets from B IP data bursts. It should be understood that sliding windows are used for operation here.

For example, the variable M may be defined by the following equation:

$$M=B+\max(0;\max(J;P)-D)+\max(0;D-B),$$

where max( ) is the maximum function, J and P are two variables representative of two interleaving depths that we will return to later on, and D is a duration that is expressed as a number of bursts Si and which represents the time difference between the moment when the data from a burst Si is received and the moment when the data from that same first Si is transmitted by the hybrid infrastructure (and more specifically by the satellite platform PFC), once it has been encoded by the codec CD.

Each first matrix may be considered to be a block of B subblocks which are each created from a certain number of columns of data derived from an IP burst Si (and constituting a subset of that data).

the variable B is at least equal to two. Consequently, the data subsets from each burst Si are distributed among at least two successive first matrices (Si and Si+1). For example, the value of B may be equal to three or four, or even more.

The number C of columns in each first matrix is, for example, equal to 191. The number T of rows in each first matrix is, for example, no greater than 1024.

It should be noted that the M first matrices may, for example, be created by means of the technique known as "multiprotocol encapsulation" (or MPE). It should also be noted that when the encoding technique is the one that is called MPE-IFEC, each first matrix is what a person skilled in the art calls an application data table (or ADT).

A second main step of the inventive method consists of creating in parallel M second matrices, each with T rows and N columns, with parity symbols that result from an encoding of the data that is respectively contained within the T rows of each of the M first matrices created during the first main step.

It should be understood that each second matrix is derived from (and therefore associated with) one of the M first matrices.

For example, the M second matrices may be created by means of the technique known as "forward error correction" (or FEC). If so, the row encoding is Reed-Solomon (or RS), and each second matrix is what the person skilled in the art calls an FEC data table (or FDT).

The number N of columns in each second matrix is, for example, equal to 64 (for DVB-SH).

A third main step of the inventive method consists of creating in parallel M third matrices, each with K rows and C columns, with parity symbols that result from an encoding of the data that is respectively contained within the C columns of each of the M first matrices created during the first main step.

It should be understood that each third matrix is derived from (and therefore associated with) one of the M first matrices.

For example, the M third matrices may be created by means of the technique known as "forward error correction" (or FEC). If so, the now encoding is Reed-Solomon (or RS), and each third matrix is what the person skilled in the art calls an FEC data table (or FDT).

The number K of rows in each second matrix is, for example, equal to 64 (for DVB-SH).

It is important to note that the second and third main steps may be carried out roughly simultaneously.

It should be noted that the second and third matrices which are derived from (and therefore associated with) one of the M first matrices may be considered to be two complementary parts of a "product matrix" made up of parity symbols that may also be called "product codes" Ci,j here (i and j respectively designate a row and column). Each row of this product matrix constitutes, for example, a code word RS from the Galois field GF(q) having an error correction capacity t1, and each column of that product matrix constitutes, for example, a code word RS of the Galois field GF(q) having an error correction capacity t2.

It should be noted that the first, second, and third main steps may be implemented by a coding module MC of the codec CO that equips the satellite platform PFC.

A fourth main step of the inventive method particularly consists of distributing, by means of double interleaving, both J subsets of parity symbols from each second matrix into J successive sets Ei, and P subsets of parity symbols from each third matrix into P of those Ei successive sets.

As previously indicated, the variables J and P are representative of two interleaving depths of the inventive encoding method. Here, the term "interleaving depth" refers to the number of successive data sets Ei among which the subsets of parity symbols from a second or third matrix are distributed.

One of the two variables J and P may be greater than or equal to one, while the other must be greater than or equal to two. For example, the value of J may be equal to two or three, or even greater, and the value of P may be equal to three or four, or even greater.

It should be noted that J may be equal to P, but this is not mandatory.

The fourth main step also consists of placing the respective data from each of the successive sets Ei the respective data from the received successive bursts Si. Each set Ei produced by the inventive coding method is therefore ultimately created at least from the data from one of the received bursts Si, from J subsets of parity symbols taken from J second matrices, and from P subsets of parity symbols taken from P third matrices.

It should also be noted that the fourth main step may be implemented by an interleaving module ME of the codec CD that equips the satellite platform PFC and which is coupled to the encoding module MC of the codec CD.

FIG. 2 schematically depicts an example encoding of IP burst data performed by means of a codec C implementing the inventive method. In this example, the variable M is equal to 4, the variable B is equal to 3, the variable J is equal to 2, and the variable P is equal to 4. Furthermore, the "top" part of FIG. 2 shows eight bursts S1 to S8 successively received by the satellite platform PFC, the "intermediate" platform from FIG. 2 shows the four parallel associations (M=4) from a first matrix (ADT), from a second matrix (FDT1) derived from that first matrix (ADT), and from a third matrix (FDT2), derived from that first matrix (ADT), and the "bottom" part of FIG. 2 shows five sets E4 to E8 successively created ("as they come") from previously received bursts Si and from second (FDT1) and third (FDT2) matrices of the aforementioned associations (in accordance with the one-way arrows).

On the receiving end (i.e. in the terminals TC), the incorrect bursts are gradually corrected, given that the aforementioned sets Ei, which are transmitted successively via the satellite SAT and via the radio access network RA, comprise complementary subsets of parity symbols, and that one must wait until at least (B+max(J,P)−D) burst time slices have been received (sets Ei and corresponding FEC) in order to have all the parity symbols (FEC) needed to correct the content data from a burst Si initially received by the satellite platform PFC.

On the receiving end, the decoding of the content data (which includes the potential corrections) is ensured by the codecs CD of the terminals TC.

The invention is particularly advantageous, as it makes it possible to perform efficient correction both in an ITS environment and a SUB environment. Additionally, it makes it possible to reduce the bandwidth used for error correction redundancy because the encoding rate is lower, and consequently it makes it possible to increase the number of broadcast services owing to the superior performance afforded by the product codes in error correction. Furthermore, the invention offers operators more flexibility in sizing their hybrid infrastructure, because it makes it possible to improve the quality of the services and save on bandwidth. Finally, given that the interleaving depths (J and P) may be low, the perceived quality of the content is improved, and the switching time between different channels of content (or "zapping time") is reduced (in the event of an error, simply wait for a period of time equal to min(J,P) to change the channel).

The invention is not limited to the embodiments of the encoding method, codec, and platform (or gateway) described above, which are only given by way of example; rather, it encompasses all variants that a person skilled in the art may envision within the framework of the claims below.

The invention claimed is:

1. A method for encoding data to be transmitted via a wave-based transmission infrastructure, comprising:
   creating a first select quantity of first matrices in parallel, each first matrix with a second select quantity of rows and a third select quantity of columns, each first matrix with data subsets from successive received bursts, the data subsets from each burst being distributed within at least two successive first matrices,
   creating the first select quantity of second matrices in parallel, each second matrix with the second select quantity of rows and a fourth select quantity of columns, each second matrix with parity symbols resulting from an encoding of the data that is respectively contained in the rows of each of the first matrices,
   creating the first select quantity of third matrices in parallel, each third matrix with a fifth select quantity of rows and the third select quantity of columns, each third matrix with parity symbols resulting from an encoding of the data that is respectively contained in the columns of each of the first matrices,
   interleaving subsets of parity symbols from each second matrix and subsets of parity symbols from each third matrix into successive sets, and
   placing the respective data from the successive received bursts into each of the successive sets.

2. The method according to claim 1, wherein the first select quantity is defined by the equation $$M=B+\max(0;\max(J;P)-D)+\max(0;D-B),$$

where M is the first select quantity, B is a quantity of successive received bursts, max( ) is a maximum function, J is a quantity of subsets of parity symbols from each second matrix that is interleaved into successive sets, P is a quantity of subsets of parity symbols from each third matrix that is interleaved into the successive sets, and D is a duration, expressed as a number of bursts, between receiving the data from one burst and transmitting the corresponding burst from the infrastructure.

3. The method according to claim 2, wherein B is equal to 3.

4. The method according to claim 2, wherein J is equal to 2.

5. The method according to claim 2, wherein P is equal to 4.

6. The method according to claim 1, wherein the first matrices are created using "multiprotocol encapsulation (MPE)".

7. The method according to claim 1, wherein the second matrices and the third matrices are created using "forward error correction (FEC)".

8. An encoding device for communication via a wave-based transmission infrastructure, the encoding device comprising:
   an encoding processor configured to create a first select quantity of first matrices in parallel, each first matrix with a second select quantity of rows and a third select quantity of columns, each first matrix with data subsets from successive received bursts, the data subsets from each burst being distributed among at least two successive first matrices, wherein the encoding processor is also configured to create the first select quantity of second matrices in parallel, each second matrix with the second select quantity of rows and a fourth select quantity of columns, each second matrix with parity symbols resulting from an encoding of the data respectively contained in the rows of each of the first matrices, wherein the encoding processor is also configured to create the first select quantity of third matrices in parallel, each third matrix with a fifth select quantity of rows and the third select quantity of columns, each third matrix with parity symbols resulting from an encoding of the data respectively contained in the columns of each of M the first matrices, and
   an interleaving processor configured to interleave subsets of parity symbols from each second matrix and subsets of parity symbols from each third matrix into successive sets, wherein the interleaving processor is also configured to place the respective data from the successive received bursts into each of said successive sets.

9. The encoding device according to claim 8, wherein said encoding processor is configured to create the first matrices using "multiprotocol encapsulation (MPE)".

10. The encoding device according to claim 8, wherein said encoding processor is configured to create the third matrices using "forward error correction (FEC)".

11. The encoding device according to claim 8, wherein the first select quantity is defined by the equation $$M=B+\max(0;\max(J;P)-D)+\max(0;D-B),$$

where M is the first select quantity, B is a quantity of successive received bursts, max( ) is a maximum function, J is a quantity of subsets of parity symbols from each second matrix that is interleaved into successive sets, P is a quantity of subsets of parity symbols from each third matrix that is interleaved into the successive sets, and D is a duration, expressed as a number of bursts, between receiving the data from one burst and transmitting the corresponding burst from the infrastructure.

12. The encoding device according to claim 11, wherein B is equal to 3.

13. The encoding device according to claim 11, wherein J is equal to 2.

14. The encoding device according to claim 11, wherein P is equal to 4.

15. The encoding device according to claim 8, wherein the wave-based transmission infrastructure includes at least one of a wireless broadcasting network, a cellular network, a mobile network, and a metropolitan area network.

16. The encoding device according to claim 8, wherein the wave-based transmission infrastructure includes at least one of a satellite transmission channel and a terrestrial radio transmission channel.

17. The encoding device according to claim 8, wherein the encoding device is implemented within at least one of a satellite-based platform, a satellite-based gateway, a communication satellite, and a radio access network.

18. A method for encoding data to be transmitted via a wave-based transmission infrastructure, comprising:
   receiving successive data bursts originating from a content source;
   creating a set of first matrices, each first matrix formed by a first select quantity of rows and a second select quantity of columns, each first matrix including a subset of column data from each of two or more of the successive data bursts, the subsets of column data from each data burst being distributed over multiple first matrices in the set of first matrices;
   encoding data from the rows of each first matrix to form one or more row parity symbols for each row of each first matrix;
   creating a set of second matrices corresponding to the set of first matrices, each second matrix including the row parity symbols for the corresponding first matrix arranged in the first select quantity of rows for the corresponding first matrix, each second matrix including one or more columns in relation to the one or more row parity symbols encoded for the rows of the corresponding first matrix;
   encoding data from the columns of each first matrix to form one or more column parity symbols for each column of each first matrix;
   creating a set of third matrices corresponding to the set of first matrices, each third matrix including the column parity symbols for the corresponding first matrix arranged in the second select quantity of columns for the corresponding first matrix, each third matrix including one or more rows in relation to the one or more column parity symbols encoded for the columns of the corresponding first matrix;
   placing respective data from the received successive data bursts into successive encoded data sets;
   interleaving the row parity symbols from each second matrix into the successive encoded data sets; and
   interleaving the column parity symbols from each third matrix into the successive encoded data sets.

19. The method according to claim 18, wherein the encoding to form the row parity symbols is based at least in part on Reed-Solomon encoding.

20. The method according to claim 18, wherein the encoding to form the column parity symbols is based at least in part on Reed-Solomon encoding.

* * * * *

UNITED STATES PATENT AND TRADEMARK OFFICE
CERTIFICATE OF CORRECTION

| | | |
|---|---|---|
| PATENT NO. | : 8,677,210 B2 | Page 1 of 1 |
| APPLICATION NO. | : 13/145880 | |
| DATED | : March 18, 2014 | |
| INVENTOR(S) | : Sayadi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 193 days.

Signed and Sealed this
Twenty-fifth Day of August, 2015

Michelle K. Lee
*Director of the United States Patent and Trademark Office*